United States Patent
Huang et al.

(10) Patent No.: US 9,338,893 B2
(45) Date of Patent: May 10, 2016

(54) FLEXIBLE ELECTRONIC DEVICE

(71) Applicant: AU Optronics Corp., Hsin-Chu (TW)

(72) Inventors: Annie Tzu-yu Huang, Hsin-Chu (TW); Shih-Hsing Hung, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 129 days.

(21) Appl. No.: 14/217,484

(22) Filed: Mar. 18, 2014

(65) Prior Publication Data

US 2015/0003024 A1    Jan. 1, 2015

(30) Foreign Application Priority Data

Jun. 26, 2013  (CN) .......................... 2013 1 0259634

(51) Int. Cl.
| H05K 1/00 | (2006.01) |
| H05K 3/28 | (2006.01) |
| H05K 1/03 | (2006.01) |
| H05K 1/16 | (2006.01) |
| H05K 3/00 | (2006.01) |

(52) U.S. Cl.
CPC .............. *H05K 3/281* (2013.01); *H05K 1/0393* (2013.01); *H05K 1/16* (2013.01); *H05K 3/007* (2013.01); *H05K 2201/09154* (2013.01); *H05K 2203/0594* (2013.01)

(58) Field of Classification Search
CPC .................. H05K 1/0393; H05K 1/16; H05K 2201/09154; H05K 2203/0594; H05K 3/007; H05K 3/281
USPC ........... 361/749, 757, 760; 174/254, 256, 260
See application file for complete search history.

(56) References Cited

U.S. PATENT DOCUMENTS

| 5,796,586 A | 8/1998 | Lee | |
| 2008/0239576 A1 | 10/2008 | Higashi | |
| 2009/0021678 A1* | 1/2009 | Son | G02F 1/133305 349/122 |
| 2009/0186181 A1* | 7/2009 | Mase | B29C 63/02 428/40.1 |
| 2011/0291544 A1 | 12/2011 | Wei | |
| 2012/0107978 A1 | 5/2012 | Shin | |
| 2013/0288120 A1 | 10/2013 | Iida | |
| 2014/0061610 A1* | 3/2014 | Mun | C08J 7/047 257/40 |
| 2015/0201498 A1* | 7/2015 | Lin | H05K 1/189 361/749 |

FOREIGN PATENT DOCUMENTS

| CN | 101351738 A | 1/2009 |
| CN | 101616542 A | 12/2009 |
| JP | 2007152939 A | 6/2007 |
| JP | 2008251120 | 10/2008 |
| KR | 1019980019024 A | 6/1998 |
| KR | 1020120045682 | 5/2012 |
| TW | 201143503 | 12/2011 |
| TW | 201302862 | 1/2013 |

* cited by examiner

*Primary Examiner* — Yuriy Semenenko
(74) *Attorney, Agent, or Firm* — Winston Hsu; Scott Margo

(57) ABSTRACT

A flexible electronic device includes a flexible film, an electronic element layer, and a protecting film, wherein the electronic element layer is disposed on a top surface of the flexible film, and the protecting film is disposed on the top surface of the flexible film and covers the electronic element layer. The protecting film has at least one side wall connected to the top surface of the flexible film to form an included angle between the side wall and the flexible film, wherein the included angle is an acute angle.

10 Claims, 4 Drawing Sheets

FLEXIBLE ELECTRONIC DEVICE

BACKGROUND OF THE INVENTION

1. Field of the Invention

The present invention relates to a flexible electronic device, and more particularly, to a flexible electronic device having a particular structural design, which can avoid the sudden increase of peeling force during the debonding process.

2. Description of the Prior Art

Conventional flexible electronic devices is fabricated by temporarily sticking a flexible film on a glass carrier with a temporary adhesive, followed by carrying out necessary fabrication processes of each kind of electronic elements on the flexible film. Finally, a debonding process is carried out to detach the flexible film from the glass carrier by separating the flexible film from glass using a debonder which utilizes a roller, thin threads, or other tools. However, due to the multilayer structure and multiple elements of the electronic device, the uneven thickness results in variation of peeling force during the debonding process, especially at a portion around the edge of the protecting film where the peeling force increases sharply. Such situations lead to the difficulty of the debonding process, also results in the damages of the electronic element and decreased yield. Therefore, significantly improving the increased difficulty caused by the sharply increased debonding strength during the debonding process is the main objective in the field.

SUMMARY OF THE INVENTION

It is one of the objectives of the present invention to provide a flexible electronic device, which includes a protecting film having a particular structure, so as to prevent the flexible electronic device suffering from the damages caused by the debonding process.

The present invention discloses a flexible electronic device which includes a flexible film, an electronic element layer, and a protecting film. The flexible film has a top surface, the electronic element layer is disposed on the top surface of the flexible film, and the protecting film is disposed on the top surface of the flexible film and covers the electronic element layer. The protecting film has at least one side wall connected to the top surface of the flexible film to form an included angle between the side wall and the top surface, wherein the included angle is an acute angle.

The present invention also discloses a flexible electronic device which includes a flexible film, an electronic element layer, and a protecting film, wherein the flexible film has a top surface, the electronic element layer is disposed on the top surface of the flexible film, and the protecting film is disposed on the top surface of the flexible film and covers the electronic element layer. The protecting film has an outer periphery having a gradual slope structure, and the gradual slope structure has a thickness being increased from an outer side toward an inner side of the protecting film.

Since the flexible electronic device of the present invention has an acute angle between the side wall of the protecting film and the flexible film, and the periphery of the protecting film has a thickness increased from an outer side toward an inner side thereof to perform a gradual slope structure, it can significantly avoid the suddenly and sharply raise of the peeling force in the debonding process, so as to obtain improved yield.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
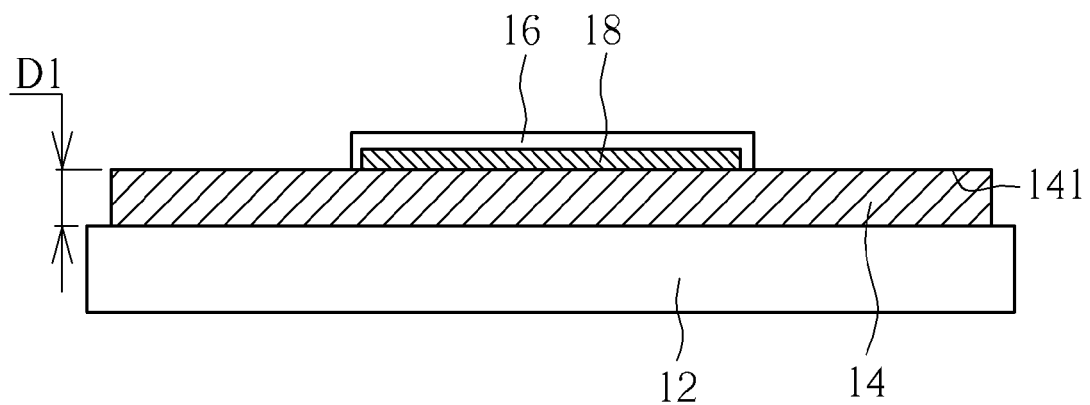
FIG. 1 to FIG. 5 are illustrating a fabrication process of a flexible electronic device of the present invention.

Referring to FIG. 1 to FIG. 5, FIG. 1 to FIG. 5 are illustrating a fabrication process of a flexible electronic device of the present invention. As shown in FIG. 1, according to the fabrication process of the flexible electronic device of the present invention, a flexible film 14 is first attached on a surface of a carrier 12 via an adhesive layer (such as a temporary adhesive, not shown in the drawings), wherein the material of the flexible film 14 for example may include at least one of polyethylene naphthalate (PEN), polyimide (PI), polyamide (PA), polyethersulfone (PES), and polyethylene terephthalate (PET). In some embodiments, the flexible film 14 itself may be a PEN film, a PI film, a PA film, a PES film or a PET film, but not limited thereto. The thickness D1 of the flexible film 14 is about 10 micrometers (μm) to about 50 μm, but not limited thereto. Then, a formation process of electronic element is carried out to form an electronic element layer 18 on a top surface 141 of the flexible film 14. For example, the flexible electronic device of the present invention can be a touch panel or an organic light emitting display panel. Therefore, the said fabrication process of electronic element may include the fabrication of a thin-film type touch electrode device or the fabrication related to organic electroluminescent device and switch device. The electronic element layer 18 may be, for example, an organic light emitting element array, a thin film transistor array or a touch sensing element array, but not limited thereto. The flexible electronic device of the present invention can also be any other electronic device required to be fabricated on the flexible film. After the fabrication process of electronic element layer 18, a package process is carried out to the formed electronic element layer 18, for example forming an encapsulated film 16 on the top surface 141 of the flexible film 14 to cover and to encapsulate the electronic element layer 18.

Figure 2:
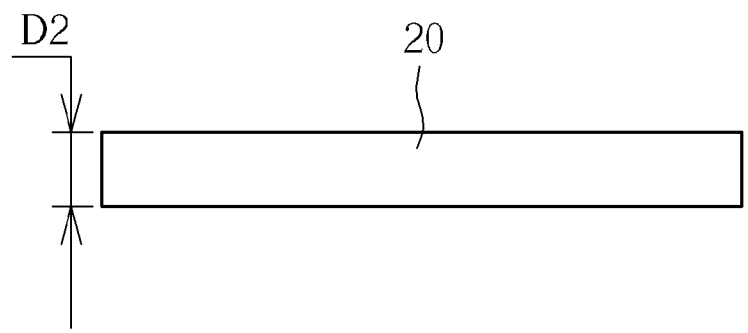
Figure 3:
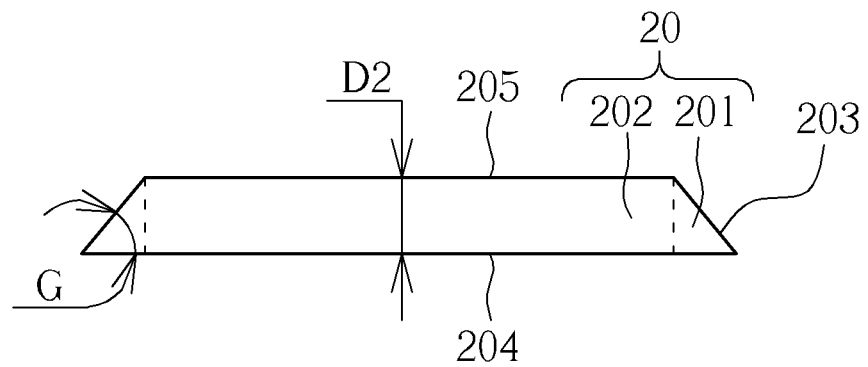

Next, referring to FIG. 2, a protecting film 20 is then provided, wherein the protecting film 20 can include a water/oxygen barrier film, a explosion proof film, an anti-glare layer and a polarizer, or the protecting film 20 itself can be anyone of the above-mentioned film. Also, the protecting film 20 can be any film required to be disposed on a surface of the electronic element layer 18. A material of the protecting film 20 for example may include plastic material, metal material, and any material which can be used as a protection for the electronic device. The protecting film 20 has an even thickness D2, for example, in a range of about 30 μm to 500 μm, but not limited thereto. Furthermore, the protecting film 20 can include only one single layer structure or a multilayer structure. Then, as shown in FIG. 3, the periphery of the protecting film 20, namely each side wall thereof, is beveled, so that a gradual slope structure 201 at the periphery of the protecting film 20 is formed, wherein the gradual slope structure 201 has a thickness being increased from an outer side toward an inner side of the protecting film 20. Also, the protecting film 20 has an included angle G between the side wall 203 and the bottom surface 204 of the protecting film 20, wherein the included angle G is an acute angle, for example being equal to or less than about 60 degrees and in a range of about 30 degrees to about 60 degrees. The said fabrication process is carried out for example by cutting each side edge of the protecting film 20 from the bottom surface 204 toward the top surface 205 of the protecting film 20, along a slope having an angle of about 30 degrees to about 60 degrees to a vertical plane. In the said fabrication process, an uncut portion of the protecting film 20 is defined as a central portion 202 of the protecting film 20, being surrounded by the gradual slope structure 201. The central portion 202 has a thickness the same as the thickness D2 of the protecting film 20, in a range of about 30 µm to 500 µm.

Figure 4:
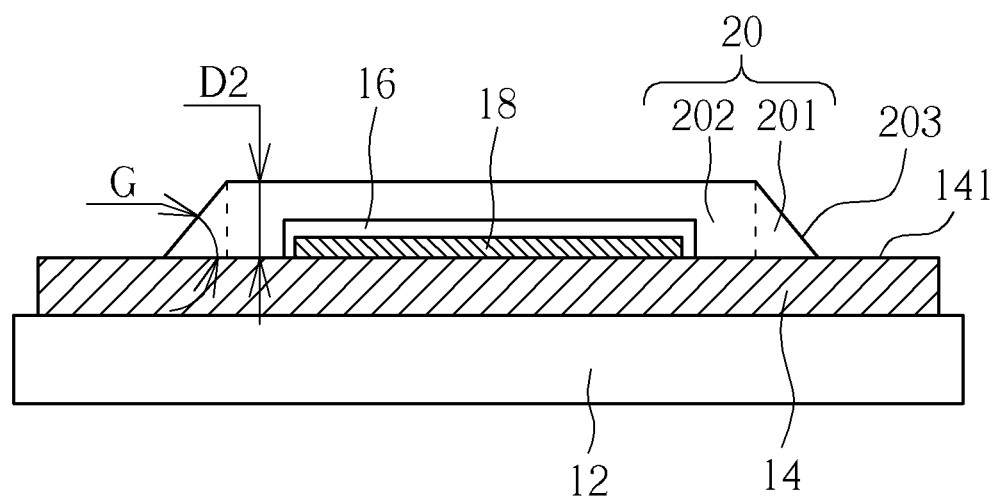
Figure 5:
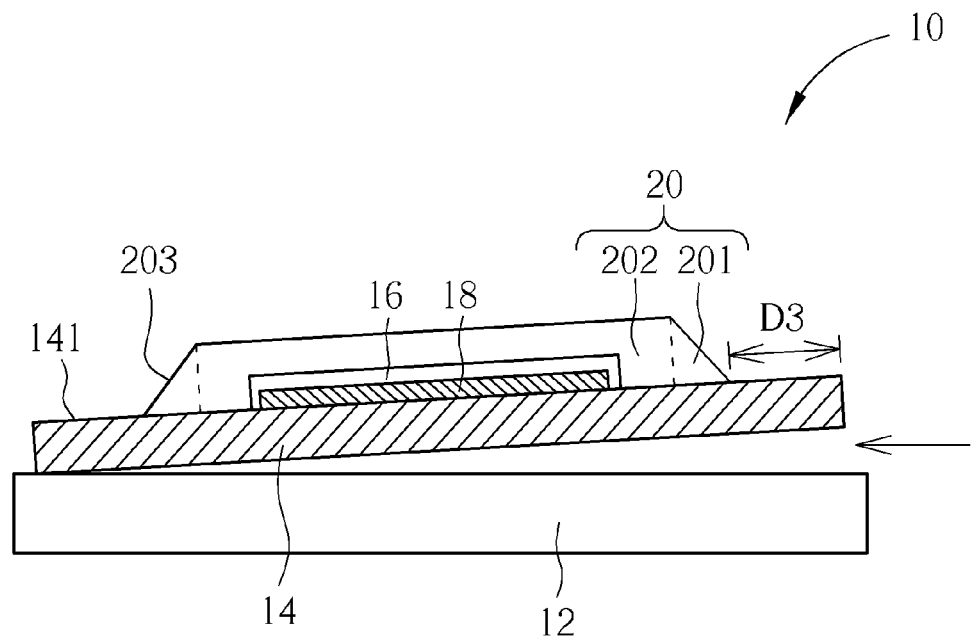

In the following, referring to FIG. 4, the protecting film 20 is attached to the top surface 141 of the flexible film 14, covering the electronic element layer 18 and the encapsulated film 16. Since the area of the protecting film 20 is less than the area of the flexible film 14, the side edge of the flexible film 14, is uncovered by the protecting film 20. In other words, the protecting film 20 only partially covers the flexible film 14 and exposes a portion of the top surface 141 of the flexible film 14, such as the outer periphery of the flexible film 14. As shown in FIG. 4, the central portion 202 of the protecting film 20 totally covers the electronic element layer 18. Then, as shown in FIG. 5, a debonding process is carried out along an arrow shown in the drawing, to detach the flexible film 14 from the carrier 12. Thus, the fabrication of the flexible electronic device 10 of the present invention is completed. It is noted that, in the fabrication of the flexible electronic device 10 of the present invention, the flexible film 14 in a big size can be fixed on the surface of the carrier 12 at first, followed by fabricating a plurality of the electronic element layers 18 thereon, encapsulating the said electronic element layers 18, and attaching the protecting films 20 on the electronic element layers 18, and then the flexible film 14 in the big size is cut into a plurality of pieces with a small size before the debonding process, but not limited thereto. In other embodiments, the process of cutting the flexible film 14 from the big size into the small size can also be carried out either before any aforementioned process or after any aforementioned process, for example before attaching the protecting films 20.

Therefore, as shown in FIG. 4 and FIG. 5, the flexible electronic device 10 of the present invention includes the flexible film 14, the electronic element layer 18 and the protecting film 20. The flexible film 14 has the top surface 141, the electronic element layer 18 is disposed on the top surface 141 of the flexible film 14, and the protecting film 20 is disposed on the top surface 141 of the flexible film 14 and covers the electronic element layer 18. The protecting film 20 has at least one side wall 203 which is connected to the top surface 141 of the flexible film 14 to form an included angle G between the side wall 203 and the top surface 141. The included angle G is an acute angle, preferably being less than about 60 degrees, for example in a range of about 30 degrees to about 60 degrees, but not limited thereto. Furthermore, the outer periphery of the protecting film 20 has the gradual slope structure 201, and the thickness of the gradual slope structure 201 increases from the outer side toward the inner side of the protecting film 20.

Figure 6:
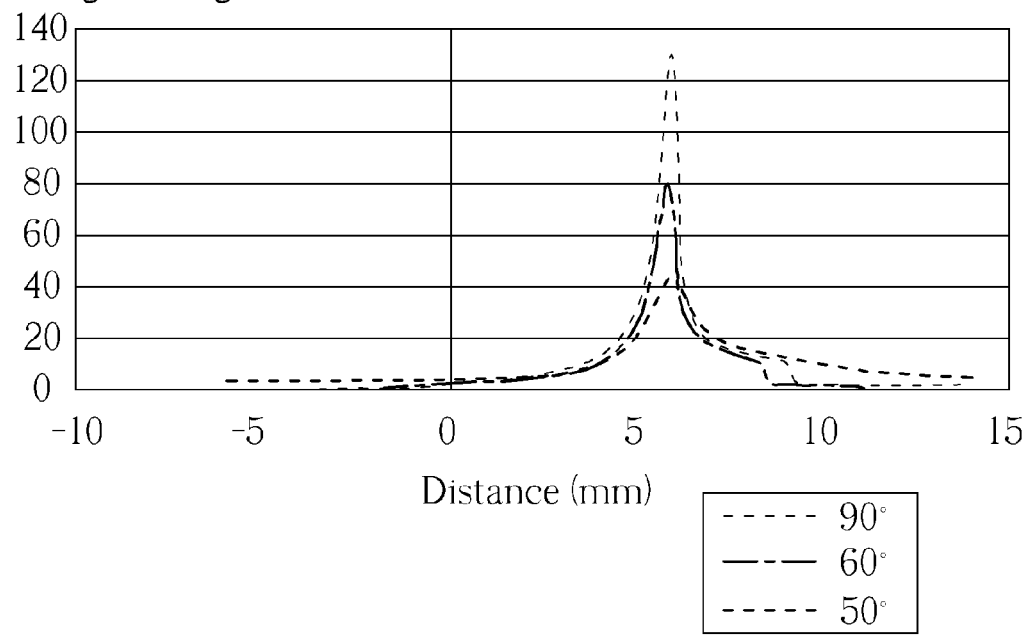
FIG. 6 is a curve graph illustrating the variation of the peeling force in the debonding process.

Referring to FIG. 6, FIG. 6 is a curve graph illustrating the variation of the peeling force in the debonding process both in the flexible electronic device of the present invention and the conventional flexible electronic device. The abscissa of FIG. 6 refers to a distance between the outer periphery of the protecting film and the side edge of the flexible film, such as a distance D3 as shown in FIG. 5. Moreover, the distance defined as about 5.5 millimeters (mm) is demonstrated in this test. An included angle formed between the protecting film and the flexible film of the conventional flexible electronic device is 90 degrees, since the protecting film of the conventional flexible electronic device has not undergone a cutting process of the side edge of the protecting film. As shown in FIG. 6, in the debonding process of the conventional flexible electronic device, since the entire thickness of the flexible electronic device suddenly increases due to the side wall of the protecting film on the flexible film, while one side edge of the flexible film is detached from the carrier in about 5.5 mm distance, the peeling force will dramatically increase to around 130 grams accordingly. On the other hand, since the protecting film of the flexible electronic device in the present invention has the gradual slope structure at the outer periphery thereof, the include angle G is than formed between the side wall of the protecting film and the top surface of the flexible film. If the include angle G refers to 60 degrees, the maximum peeling force in the debonding process will be about 80 grams, and if the include angle G refers to 50 degrees, the maximum peeling force in the debonding process will decrease to about 50 grams. In addition, the curve illustrating the variation of the peeling force in the flexible electronic device of the present invention while the include angle G is 60 degrees or 50 degrees is much more gentle than that of the conventional flexible electronic device. It is because the gradual slope structure of the protecting film in the present invention has the thickness being increased gradually from the outer side toward the inner side thereof, thus that the entire thickness of the flexible electronic device also increases gradually from the outer side toward the inner side of the protecting film rather than increases sharply. Therefore, the difficulty of the debonding caused by suddenly and sharply increased thickness of the flexible electronic device will be successfully avoided.

Figure 7:
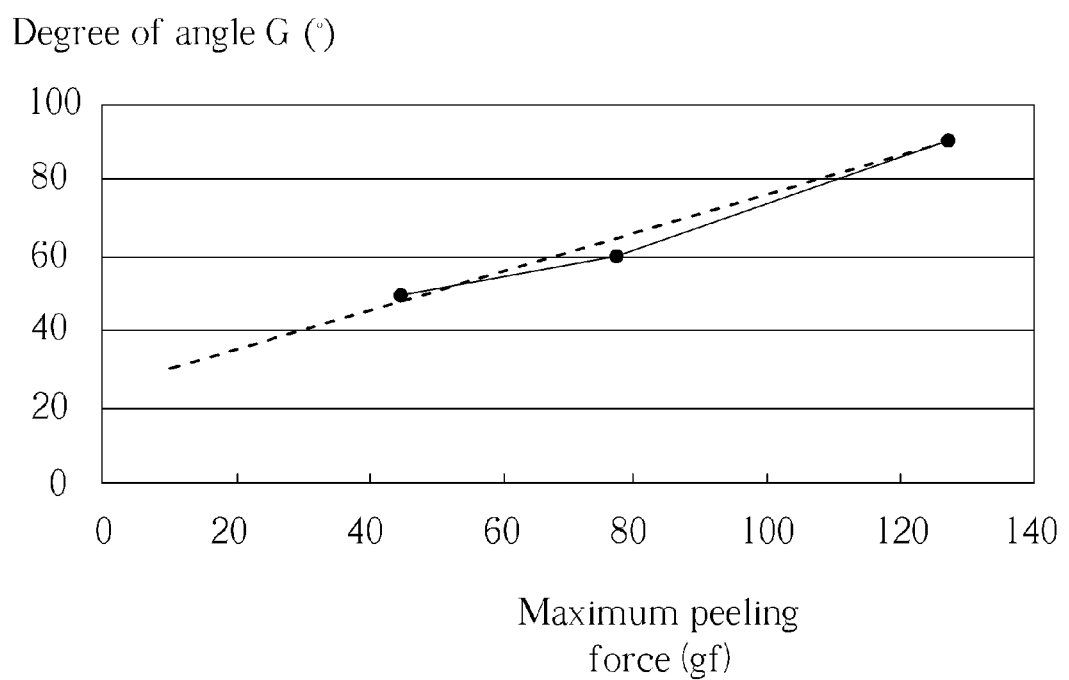
FIG. 7 is a comparative graph and a tendency chart illustrating the relation between the included angle of the protecting film in the flexible electronic device of the present invention and the maximum peeling force.

Referring to FIG. 7, FIG. 7 is a comparative graph and a tendency chart illustrating the relation between the included angle G of the flexible electronic device in the present invention and the maximum peeling force, wherein the solid line therein refers to the maximum peeling force corresponding to the included angle G, and the dotted line refers to the trend line of the maximum peeling force. As shown in FIG. 7, the slope of the gradual slope structure of the protecting film is decreased as the included angle G is decreased. Therefore, the maximum peeling force in the debonding process will also decrease accordingly, so as to effectively promote the performance of the debonding process. Also, through the trend line, it is believed that the peeling force can decrease to less than 20 grams if the included angle G can decline to 30 degrees, which more significantly lower the damages, caused by the peeling force, to the flexible electronic device. Hence, under sustainable conditions in the cutting process of the side wall of the protecting film, it is preferably that the gradual slope structure of the present invention flexible electronic device has a slope as gentle as possible, namely with the included angle G between the side wall of the protecting film and the top surface of the flexible film being as little as possible, so as to reduce the maximum peeling force as much as possible and to obtain a gentle variation of the peeling force in the debonding process.

In summary, since the flexible electronic device of the present invention includes the protecting film having an thickness being increased from the outer side toward the inner side of the protecting film, an included angle less than 90 degrees is formed between the side wall of the protecting film and the top surface of the flexible film. Therefore, the flexible electronic device of the present invention can effectively avoid the peeling force increasing suddenly and sharply in the debonding process. In the present invention, only a relatively less peeling force will be generated, thus the difficulty of the debonding process can be reduced. Therefore, the present invention is sufficient to improve the disadvantages of the conventional flexible electronic device, keeping the electronic device from the damages caused by the debonding process, so as to obtain an improved yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flexible electronic device, comprising:
  a flexible film, having a top surface;
  an electronic element layer, disposed on the top surface of the flexible film; and
  a protecting film, disposed on the top surface of the flexible film and covering the electronic element layer, an outer periphery of the protecting film having a gradual slope structure that has a thickness being increased from an outer side toward an inner side of the protecting film, wherein the protecting film comprises a central portion surrounded by the gradual slope structure, the central portion of the protecting film totally overlaps the electronic element layer and has an even and uniform thickness in a range from about 30 µm to about 500 µm, the protecting film has at least one side wall connected to the top surface of the flexible film to form an included angle between the side wall and the top surface, and the included angle is an acute angle.

2. The flexible electronic device according to claim 1, wherein the included angle is equal to or less than about 60 degrees.

3. The flexible electronic device according to claim 2, wherein the included angle has a range from about 30 degrees to about 60 degrees.

4. The flexible electronic device according to claim 1, wherein an area of the protecting film is less than an area of the flexible film, and a side edge of the flexible film is uncovered with the protecting film.

5. The flexible electronic device according to claim 1, wherein the protecting film comprises one of a water/oxygen barrier film, an explosion proof film, an anti-glare layer and a polarizer.

6. The flexible electronic device according to claim 1, wherein the protecting film comprises plastic material or metal material.

7. The flexible electronic device according to claim 1, wherein the protecting film is a single layer structure or a multilayer structure.

8. The flexible electronic device according to claim 1, wherein a material of the flexible film comprises at least one of polyethylene naphthalate (PEN), polyimide (PI), polyamide (PA), polyethersulfone (PES), and polyethylene terephthalate (PET).

9. The flexible electronic device according to claim 1, wherein the flexible film has an thickness in a range from about 10 micrometers (µm) to about 50 µm.

10. The flexible electronic device according to claim 1, wherein the electronic element layer comprises at least one of an organic light emitting element, a thin film transistor and a touch sensing element.

* * * * *